(12) United States Patent
Farwell et al.

(10) Patent No.: US 11,901,698 B2
(45) Date of Patent: Feb. 13, 2024

(54) NEGATIVE BIAS TO IMPROVE PHASE NOISE

(71) Applicant: Lumentum Technology UK Limited, Towcester (GB)

(72) Inventors: Selina Farwell, Northamptonshire (GB); Robert Griffin, Northamptonshire (GB); Samuel Davies, Northamptonshire (GB)

(73) Assignee: Lumentum Technology UK Limited, Northamptonshire (GB)

( * ) Notice: Subject to any disclaimer, the term of this patent is extended or adjusted under 35 U.S.C. 154(b) by 846 days.

(21) Appl. No.: 16/957,654

(22) PCT Filed: Dec. 21, 2018

(86) PCT No.: PCT/GB2018/053768
§ 371 (c)(1),
(2) Date: Jun. 24, 2020

(87) PCT Pub. No.: WO2019/130021
PCT Pub. Date: Jul. 4, 2019

(65) Prior Publication Data
US 2023/0208100 A1    Jun. 29, 2023

(30) Foreign Application Priority Data
Dec. 29, 2017 (GB) .................................. 1722292

(51) Int. Cl.
*H01S 5/00*    (2006.01)
*H01S 5/062*    (2006.01)
(Continued)

(52) U.S. Cl.
CPC ........ *H01S 5/06246* (2013.01); *H01S 5/0261* (2013.01); *H01S 5/042* (2013.01);
(Continued)

(58) Field of Classification Search
CPC .... H01S 5/06246; H01S 5/0261; H01S 5/042; H01S 5/062; H01S 5/0625;
(Continued)

(56) References Cited

U.S. PATENT DOCUMENTS 6,611,539 B2   8/2003   Ledentsov et al.
2003/0012244 A1*   1/2003   Krasulick .............. B82Y 20/00
                                                       372/50.1
(Continued)

FOREIGN PATENT DOCUMENTS

| | | |
|---|---|---|
| CN | 1531769 A | 9/2004 |
| GB | 2394598 A | 4/2004 |
| JP | 2016212151 A | 12/2016 |

OTHER PUBLICATIONS

Mar. 29, 2019 International Search Report and Written Opinion issued in International Application No. PCT/GB2018/053768, 11 pages.

*Primary Examiner* — Kinam Park
(74) *Attorney, Agent, or Firm* — Harrity & Harrity, LLP

(57) ABSTRACT

A method of operating an optoelectronic device comprising an optical waveguide section, the optical waveguide section comprising a semiconductor core, the method comprising the steps of determining (401) a range for a negative bias voltage for the waveguide section for which an optical loss of the core is lower than an optical loss at zero bias for an operating wavelength range of the device, selecting (402) a bias voltage within the range and applying (403) the selected bias voltage to the waveguide section.

15 Claims, 13 Drawing Sheets

(51) Int. Cl.
*H01S 5/026* (2006.01)
*H01S 5/042* (2006.01)
*H01S 5/0625* (2006.01)
*H01S 5/068* (2006.01)
*H01S 5/12* (2021.01)
*G02F 1/025* (2006.01)

(52) U.S. Cl.
CPC ............ *H01S 5/062* (2013.01); *H01S 5/0625* (2013.01); *H01S 5/06258* (2013.01); *H01S 5/06817* (2013.01); *H01S 5/124* (2013.01); *G02F 1/025* (2013.01); *H01S 5/026* (2013.01); *H01S 5/0265* (2013.01); *H01S 5/12* (2013.01); *H01S 2301/02* (2013.01)

(58) Field of Classification Search
CPC .. H01S 5/06258; H01S 5/06817; H01S 5/124; H01S 5/0265; H01S 5/12; H01S 2301/02
See application file for complete search history.

(56) References Cited

U.S. PATENT DOCUMENTS

| | | | |
|---|---|---|---|
| 2004/0076199 A1* | 4/2004 | Wipiejewski | H01S 5/0265 372/26 |
| 2005/0265679 A1 | 12/2005 | Liu et al. | |
| 2007/0217733 A1* | 9/2007 | Wada | G02B 6/12007 385/9 |
| 2008/0291957 A1* | 11/2008 | Arimoto | H01S 5/146 372/38.07 |
| 2012/0062900 A1* | 3/2012 | Langley | G02F 1/225 356/477 |
| 2012/0106984 A1* | 5/2012 | Jones | H04B 10/60 398/214 |
| 2018/0307063 A1* | 10/2018 | Stagarescu | G02F 1/3138 |

* cited by examiner

NEGATIVE BIAS TO IMPROVE PHASE NOISE

CROSS-REFERENCE TO RELATED APPLICATIONS

This application is a 371 national stage of PCT Application No. PCT/GB2018/053768, filed on Dec. 21, 2018, and entitled "NEGATIVE BIAS TO IMPROVE PHASE NOISE," which claims priority to United Kingdom Patent Application No. 1722292.8, filed on Dec. 29, 2017, and entitled "NEGATIVE BIAS TO IMPROVE PHASE NOISE," which are incorporated by reference herein.

TECHNICAL FIELD

The present disclosure relates to semiconductor optical waveguides.

BACKGROUND

Semiconductor waveguides are used in optoelectronic devices such as lasers and optical receivers. It is desirable in many applications to reduce optical loss in waveguide sections. Furthermore, in semiconductor lasers, it is desirable to minimise linewidth. Linewidth of an optical carrier is of particular importance in coherent communication systems. One major factor which causes the broadening of linewidth is Frequency Modulation (FM) noise. FM noise is the frequency domain representation of rapid, short term, random fluctuations in the frequency of a waveform, caused by fluctuations in the waveguide carrier density. During operation of a Distributed Bragg Reflector (DBR) laser, variations in electrical drive currents passing through sections of the laser arise due to statistical variations in the flow of charge carriers and electrical noise in the driving signals, for example due to electromagnetic interference and/or shot noise. Such variations drive a time dependent fluctuation of the waveguide carrier density which increases the linewidth/FM noise of the output light. Additionally the stochastic spontaneous emission of photons within the laser gain medium contributes an additional carrier density fluctuation and FM noise, the Lorentzian linewidth, the magnitude of which is strongly dependent on the cavity waveguide optical loss.

The bandgap energy for most semiconductor waveguide devices is larger than that of the guided light photons. This ensures that large inter-band absorption losses are minimized. For this configuration the dominant absorption mechanisms then become Free carrier plasma effect (FCPE) and Inter-valence band absorption (IVBA). Both of these mechanisms require a population of electrons and holes in the conduction and valance bands, respectively, and their strength is directly proportional to this population size. Since direct inter-band absorption is not possible these charge carriers may be produced by thermal excitation, current injection and much weaker inter-band absorption through a low density of localized states, the so called Urbach tail.

The presence of both of these absorption mechanisms increases the laser cavity round trip optical losses and therefore the level of FM noise due to spontaneous emission in the gain medium, so reduction of both of these processes is of great interest.

A solution to this problem has been proposed in WO 2016038333, which involves grounding the passive waveguide section of a tunable laser. This involves having a p-i-n structure that is shorted at ground potential. The grounded passive section clamps the Fermi level within and enables Urbach tail generated charge carriers and charge carriers that have leaked from adjacent sections to escape, thereby minimizing the optical absorption due to FCPE and IVBA and reducing the total linewidth of the laser cavity. FIG. 1 is a schematic diagram of a typical arrangement. FIG. 1 shows tuneable laser 100, with substrate 101, lower layer 102, guiding layer 103 and overgrowth layer 104. The laser comprises gain section 105, two passive sections 106, which are grounded 107, and two DBR sections 108, 109.

SUMMARY

In accordance with one aspect of the present invention there is provided a method of operating an optoelectronic device comprising an optical waveguide section, the optical waveguide section comprising a semiconductor core, the method comprising the steps of determining a range for a negative bias voltage for the waveguide section for which an optical loss of the core is lower than an optical loss at zero bias for an operating wavelength range of the device, selecting a bias voltage within the range and applying the selected bias voltage to the waveguide section.

In an embodiment, the bias voltage corresponds to a minimum optical loss.

In an embodiment, the selected bias is varied along a length of the waveguide section by use of a segmented electrode.

In an embodiment, the optoelectronic device is a semiconductor laser.

In an embodiment, the waveguide section is a passive section of the semiconductor laser.

In an embodiment, the waveguide section is part of an optical receiver and the optical receiver further comprises at least one photodetector.

According to a second aspect, there is provided an optical waveguide section comprising an intrinsic semi-conductor core located between doped semiconductor cladding layers and a biasing apparatus for providing a negative bias voltage across the waveguide section. The negative bias is selected from a range of voltages for which an optical loss of the core is lower than an optical loss at zero bias for a selected wavelength range.

In an embodiment, the biasing apparatus comprises a segmented electrode for varying the bias voltage along the waveguide.

According to a third aspect, there is provided an optoelectronic device comprising a waveguide section according to the second aspect.

According to a fourth aspect, there is provided a semiconductor laser having a waveguide section according to the second aspect.

In an embodiment, the laser is wavelength tuneable.

In an embodiment, the laser is thermally tuned. In an embodiment, the laser is electrically tuned.

According to a fifth aspect, there is provided an optical receiver having a waveguide section according the second aspect.

In an embodiment, the optical receiver is a coherent detector.

BRIEF DESCRIPTION OF THE DRAWINGS

The above and other aspects of the present invention will now be described by way of example only, with reference to the following figures.

DETAILED DESCRIPTION

Embodiments will now be described more fully hereinafter with reference to the accompanying drawings, in which certain embodiments are shown. However, other embodiments in many different forms are possible within the scope of the present disclosure. Rather, the following embodiments are provided by way of example so that this disclosure will be thorough and complete, and will fully convey the scope of the disclosure to those skilled in the art.

Although grounding of the waveguide is effective in reducing optical loss and FM noise, this disclosure will show that further improvements can be made by negatively biasing the waveguide. In particular, the selection of a bias voltage is possible so to optimise the optical loss in a waveguide.

When an electrical field is applied to a semiconductor waveguide, there are two competing effects which occur. These are the increasing optical absorption due Franz-Keldysh effect and the reduction in optical absorption due to Free carrier plasma effect (FCPE) and Inter-valence band absorption (IVBA).

The Franz-Keldysh effect is a shift in the strong inter-band absorption edge of a semiconductor due to an applied electric field. This broadens and moves the absorption edge of the material to lower photon energies, or longer wavelengths, and therefore increases the strong inter-band absorption effect for photons at a fixed wavelength or energy. Since it is inter-band the absorption is accompanied by a photocurrent as optical energy is converted to electrical, and the photocurrent is proportional to the light intensity.

Figure 1:
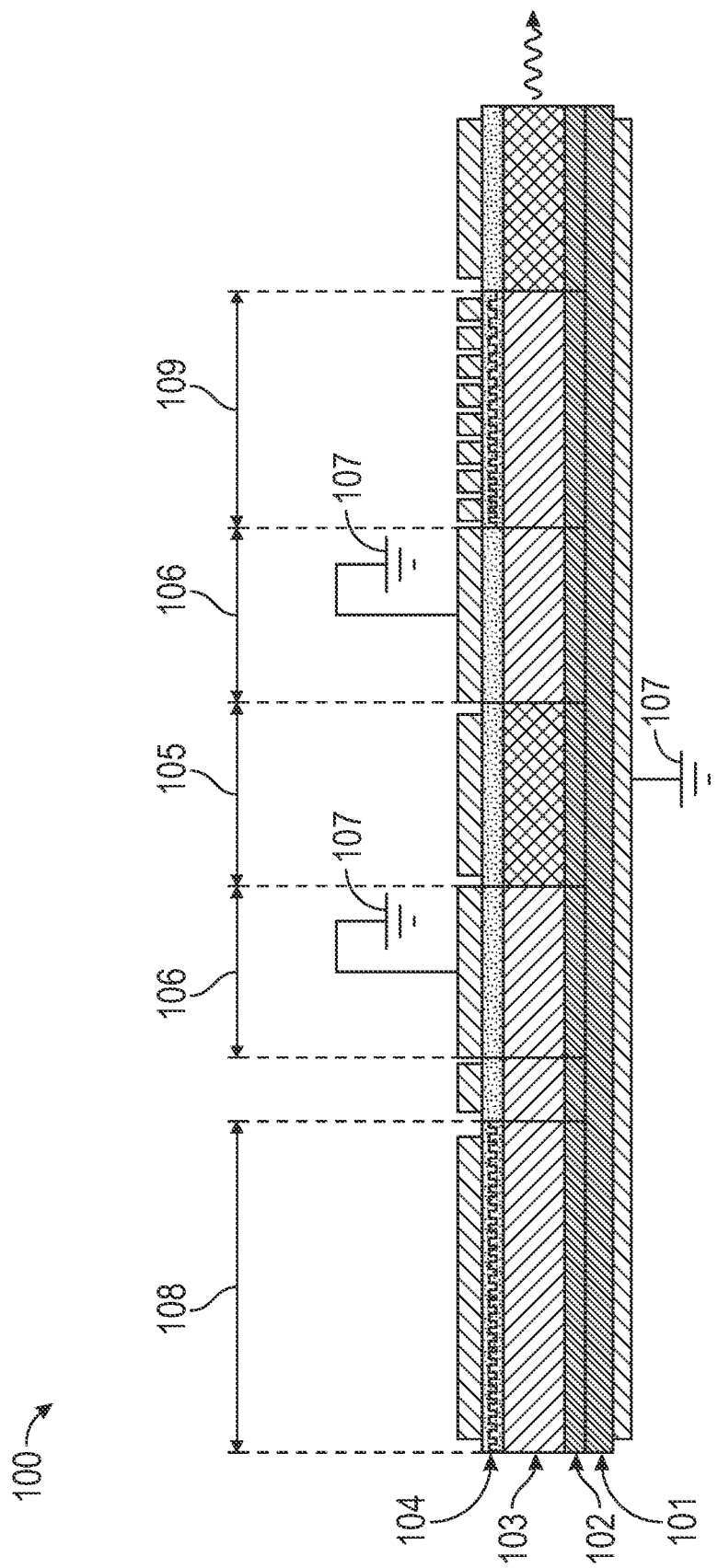
FIG. 1 is a schematic diagram of semiconductor laser with a grounded passive section according to the prior art.
Figure 2:
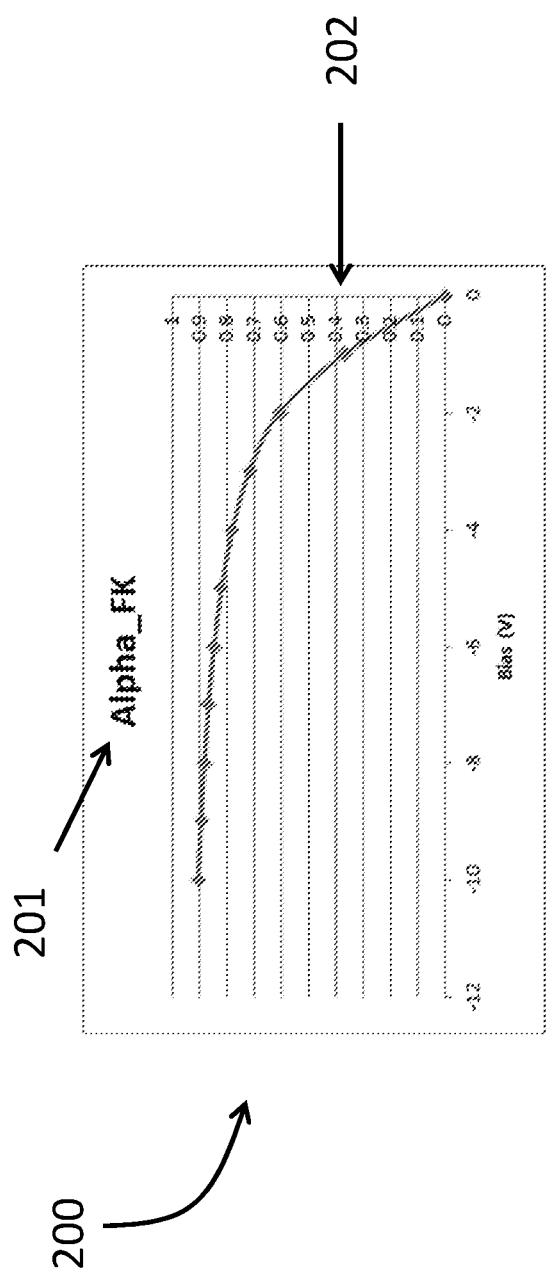
FIG. 2 is a graph of absorption coefficient against bias voltage caused by the Franz-Keldysh effect.

The competing effects in a semiconductor have been modelled to show how the absorption coefficient varies with bias voltage for each of the individual effects and the overall result. FIG. 2 is a graph 200 of normalised absorption coefficient 201 against bias voltage 203 due to the Franz-Keldysh effect. The result is an increase in the absorption coefficient as the bias voltage increases.

Published analytical expressions for the absorption coefficient strength due to FCPE and IVBA (Alpha_FCP) indicate that it is directly proportional to the waveguide carrier density N. This junction carrier density will diminish with increasing bias voltage. As the applied negative bias increases, the junction electric field increases and this encourages the charge carriers created through the weak inter-band Urbach tail absorption process to escape in the form of a small photocurrent. The result is a reduction in the steady state carrier density within the junction and a reduction in the FCPE and IVBA processes. At high enough bias the junction is completely depleted of charge carriers and the FCPE and IVBA processes are extinguished.

Figure 3:
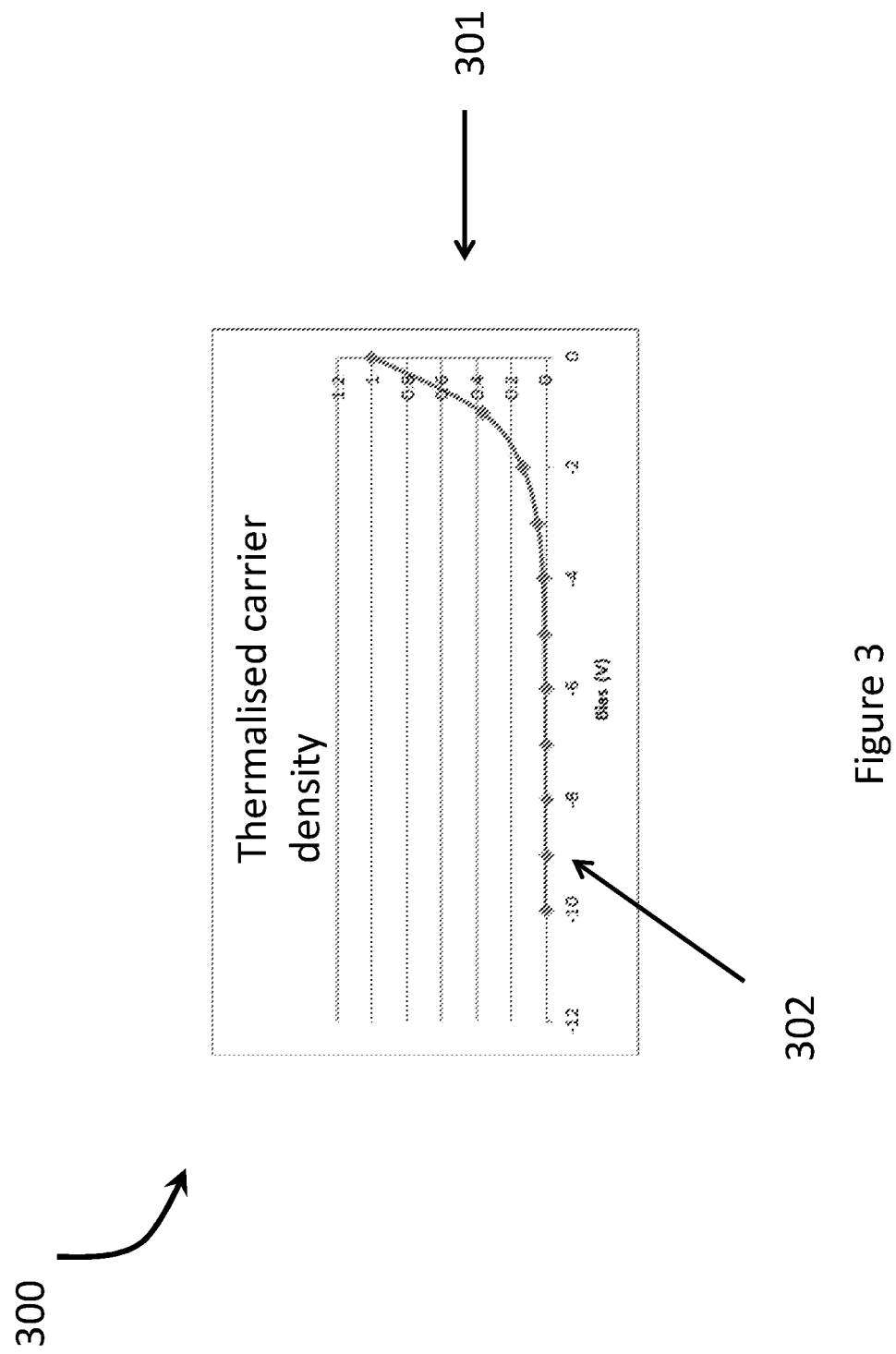
FIG. 3 is a graph of thermalized carrier density against bias voltage

FIG. 3, which is a graph 300 of thermalized carrier density 301 against bias voltage 302, illustrates this effect.

Figure 4:
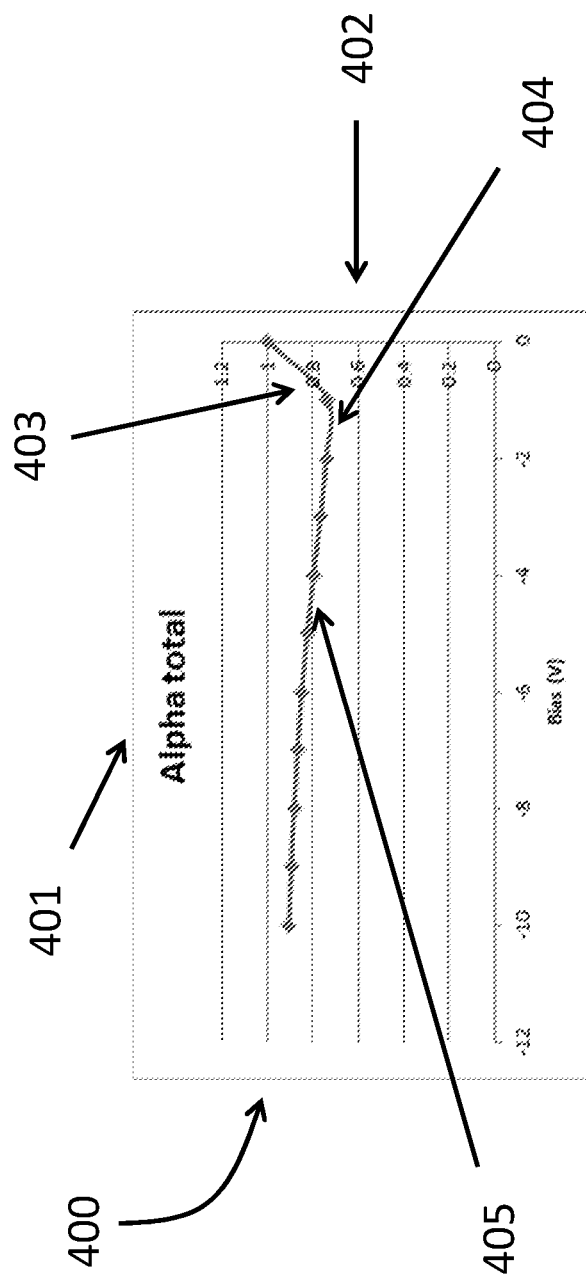
FIG. 4 is a graph of total absorption coefficient against bias voltage.

The combined effects of the FCPE/IVBA and the Franz-Keldysh effect have been modelled. FIG. 4 is a graph of the normalised total absorption coefficient 401 against bias voltage 402, which illustrate the combined effect of the two processes. The graph illustrates the initial domination 403 of the removal of charge carriers at low bias voltage, with the absorption coefficient dropping to a minimum 404. The Franz-Keldysh effect then starts to dominate absorption as bias voltage increases further 405.

These results can be used to reduce the optical loss in a semiconductor optical waveguide by the application of an appropriately chosen negative bias voltage. There is a range of bias voltages in which the optical loss is lower than for no biasing. This is typically dependent on the wavelength of the incident light. In an embodiment an operating wavelength or range of wavelengths is selected, a determination is made of the bias range for which optical loss is lower than for no bias and a negative bias within that range is selected and applied to the waveguide.

Figure 5:
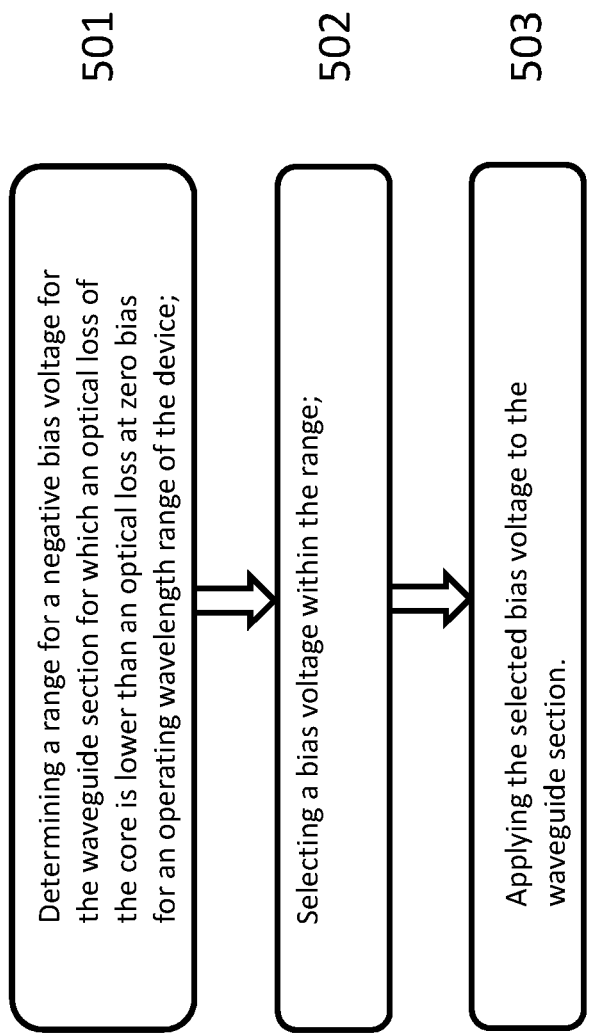
FIG. 5 is a flow chart illustrating a method according to the invention.

FIG. 5 is a flow chart illustrating the steps of determining a negative bias voltage according to an embodiment. The first step comprises determining 501 a range for a negative bias voltage for the core for which an optical loss of the core is lower than an optical loss at zero bias for the wavelength range. In an embodiment, the step comprises taking measurements for the optical loss experimentally. In another embodiment, this step comprises using a previously obtained characteristic or a theoretical estimate of the optical losses. Once the region in which the bias voltage gives an optical loss lower than that for zero bias, a bias voltage is selected 502. This voltage is then applied to an electrode connected to the waveguide 503. In an embodiment, the bias voltage is selected so as provide a minimum optical loss.

Figure 6:
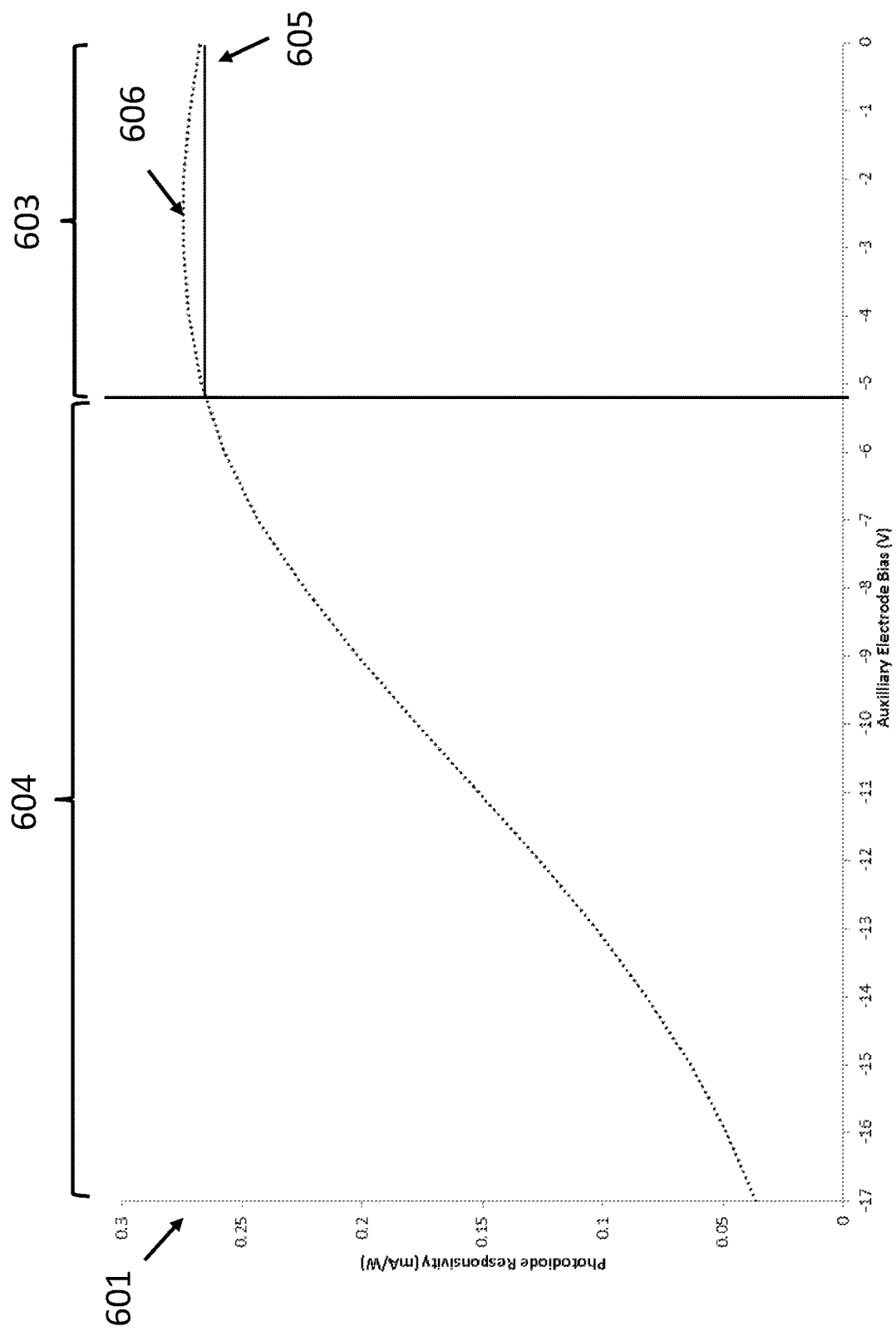
FIG. 6 is a graph illustrating a typical photodiode responsivity against auxiliary bias voltage for the process of FIG. 5.

FIG. 6 is a graph illustrating a typical photo-receiver responsivity against auxiliary bias voltage for the process of FIG. 5. The graph is a plot of photo responsivity against 601 against bias voltage 602. There is a threshold 603, which corresponds to the photo responsivity achieved at zero bias voltage. There are two regions of the graph, a first region 604 in which the photo responsivity is higher than at zero bias voltage and a second region 605, in which the photo responsivity is lower. In the first region, free carrier absorption reduction dominates and in the second region, the Franz-Keldysh effect dominates. The first region is the useful region for the method according to the present invention. Any bias voltage selected in this region reduces the free carrier absorption and increases the responsivity. In an embodiment, the bias voltage is selected to provide a maximum photo responsivity 506.

Figure 7:
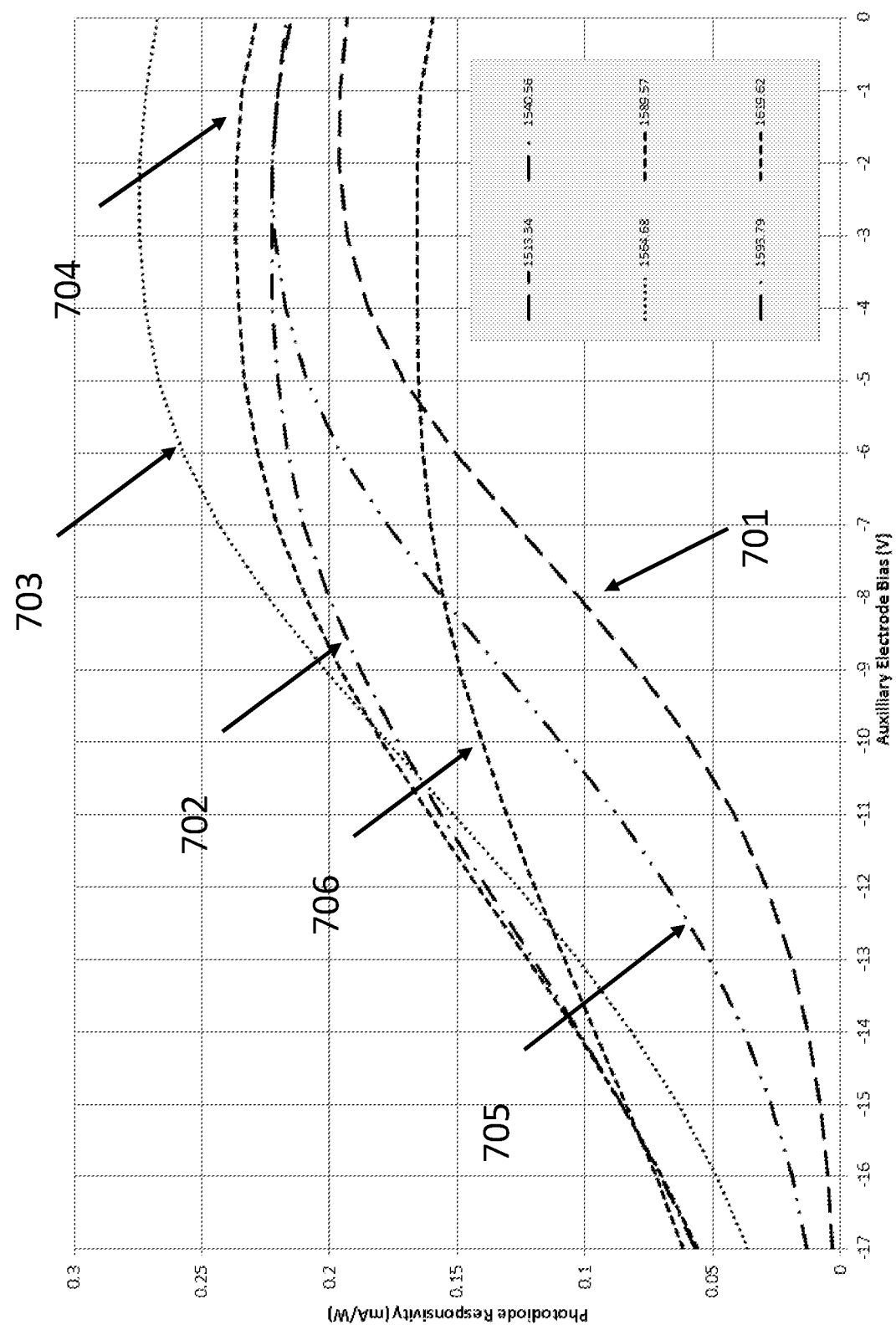
FIG. 7 is a graph illustrating a typical photodiode responsivity against auxiliary bias voltage for different wavelengths.

FIG. 7 is a graph illustrating a typical photo-receiver responsivity against auxiliary bias voltage for different wavelengths. The characteristics for six wavelengths within the C-band are shown, namely 1513.34 nm 701, 1540.56 nm 702, 1564.68 nm 703, 1589.57 nm, 704, 1593.79 nm 705 and 1619.62 nm 706.

Figure 8:
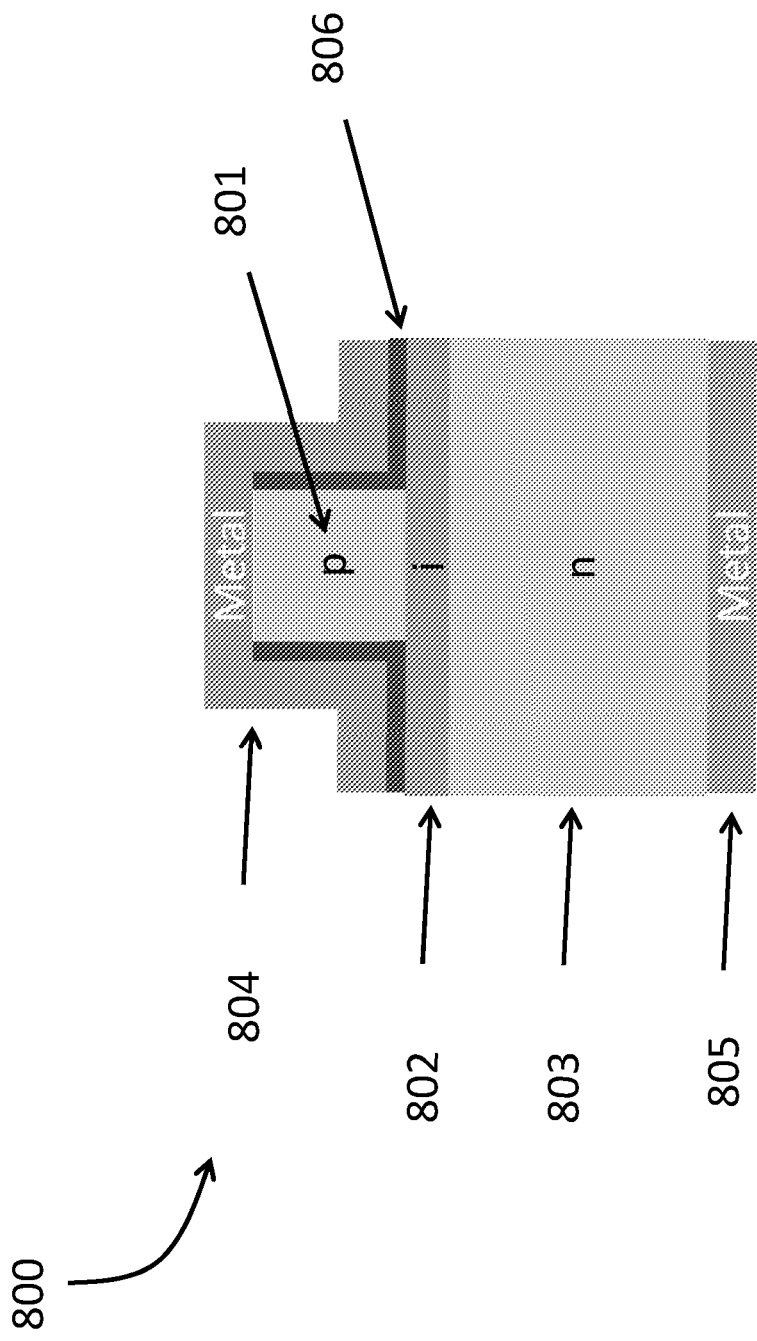
FIG. 8 is a cross sectional diagram of a waveguide used in an embodiment.
Figure 9:
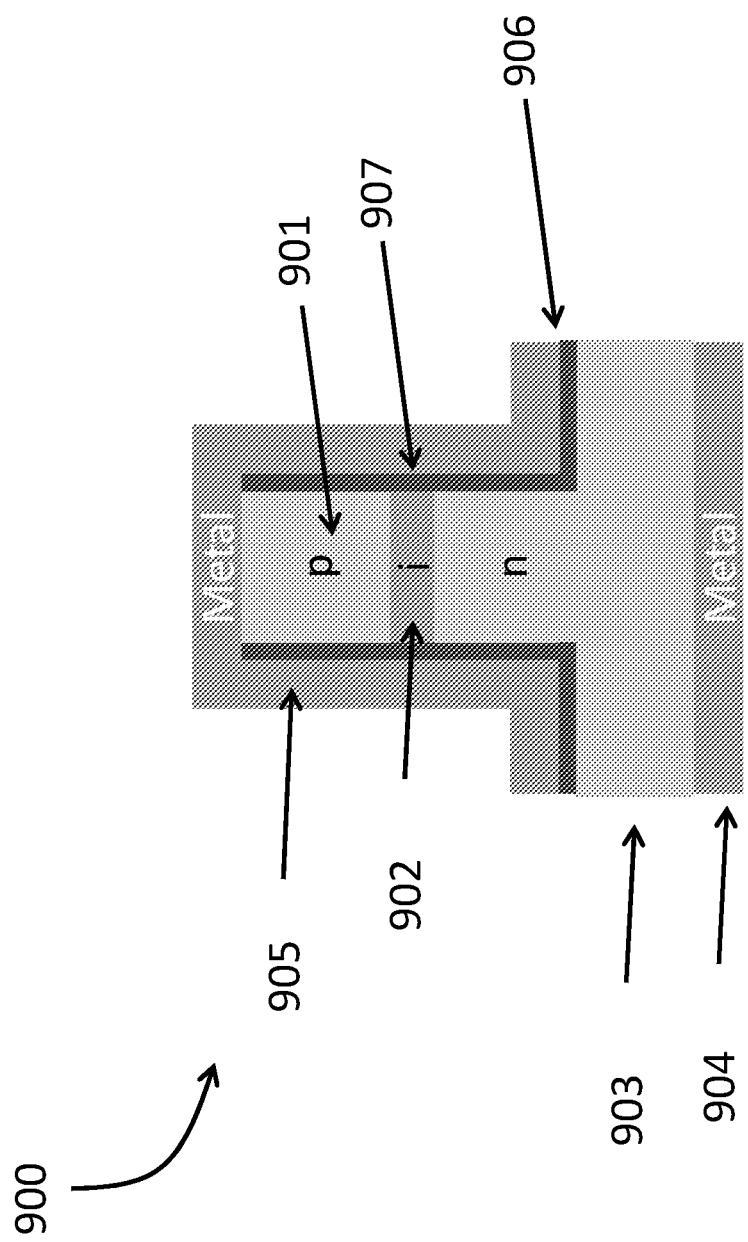
FIG. 9 is a cross sectional diagram of a waveguide used in another embodiment.

The above process may be used in a number of applications, including tuneable lasers and coherent receivers. FIGS. 8 and 9 are cross sectional diagrams of waveguide arrangements for lasers and for modulators/receivers respectively. FIG. 8 illustrates a waveguide 800 for a laser. This is a weakly guiding waveguide, with no horizontal sidewalls. A laser is operated in forward bias and the dominant process is radiative. If sidewalls are present, non-radiative processes are introduced, which, due to their short lifetimes will dominate. Hence a weakly guiding waveguide is ideal for lasers. FIG. 8 is a cross sectional diagram of such a waveguide 800, showing the p-doped 801, intrinsic 802 and n-doped 803 layers of the guide, metal electrodes 804, 805 for the application of a negative bias and dielectric layer 806. FIG. 9 is a cross sectional diagram of a strongly guiding waveguide 900 suitable for modulators and receivers. Here the presence of sidewalls 907 enables the bending of the waveguide, which is necessary for the structure of modulators and receivers. There is illustrated, as for the weakly guiding case, the p-doped 901, intrinsic 902 and n-doped 903 layers of the guide, metal electrodes 904, 905 for the application of a negative bias and dielectric layer 906.

Figure 10:
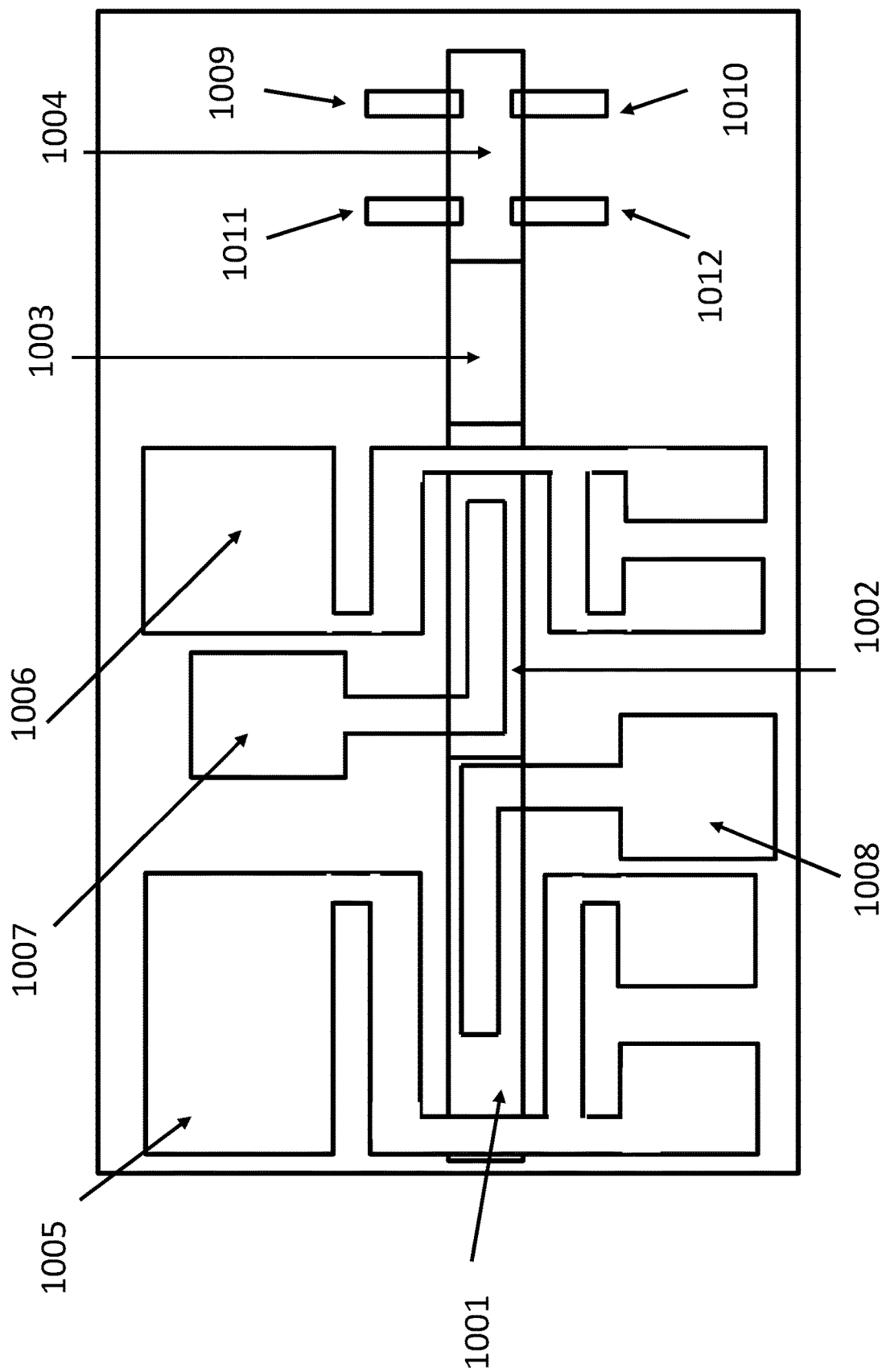
FIG. 10 is a schematic diagram of a tuneable laser with negative bias employed.

FIG. 10 is a schematic diagram of a typical four-section tuneable laser. Thermal or electrical tuning of the refractive index in each section is possible using the thermo-optic effect or forward bias electrical tuning of the carrier density likewise affecting refractive index. The four sections are respectively a rear reflector 1001, phase section 1002, gain section 1003 and front reflector 1004. In the example illustrated, thermal tuning is used in the rear reflector, for which a rear grating heater 1005 is provided. A phase section heater 1006 is provided to tune the phase section 1002. Tap electrodes 1007, 1008 are provided for the rear reflector and phase sections respectively. The tap electrodes are designed to remove the excess carriers (causing optical loss) using negative bias. The tuning electrodes are situated in close proximity to tap electrodes. For the electrically tuned sections (forward pumped 1009, 1010), the spare unused electrodes (1011, 1012) can be set at a negative bias or grounded as the application requires.

In an embodiment, the tuneable laser comprises an Indium Phosphide-based ridge waveguide. In an embodiment, the tap electrodes are situated on the top of the ridge waveguide and the heaters are in close proximity. However, the person skilled in the art will appreciate that other topologies would be acceptable and the invention is not limited to any one topology. In the embodiment of FIG. 9, the tap electrodes are above the optical mode, where the photo-carriers are generated, which allows for most efficient carrier withdrawal (within the carrier diffusion distance). The thermal heaters are situated within a few microns of the tap electrodes and therefore there is very little compromise to thermal tuning efficiency. The heater topology can be symmetric or asymmetric about the ridge, driven in series or parallel as shown here.

In an embodiment the TT-NLL the rear tap and phase tap electrodes are used as detectors to simultaneously ground the RF and apply negative bias to draw out the carriers. Depending on the optical power density at different distances through the laser, the optimum negative bias may be dependent upon the distance along the waveguide. This can be addressed either using large electrodes with slightly compromised bias voltage for the changing carrier density with distance or using segmented electrodes.

Figure 11:
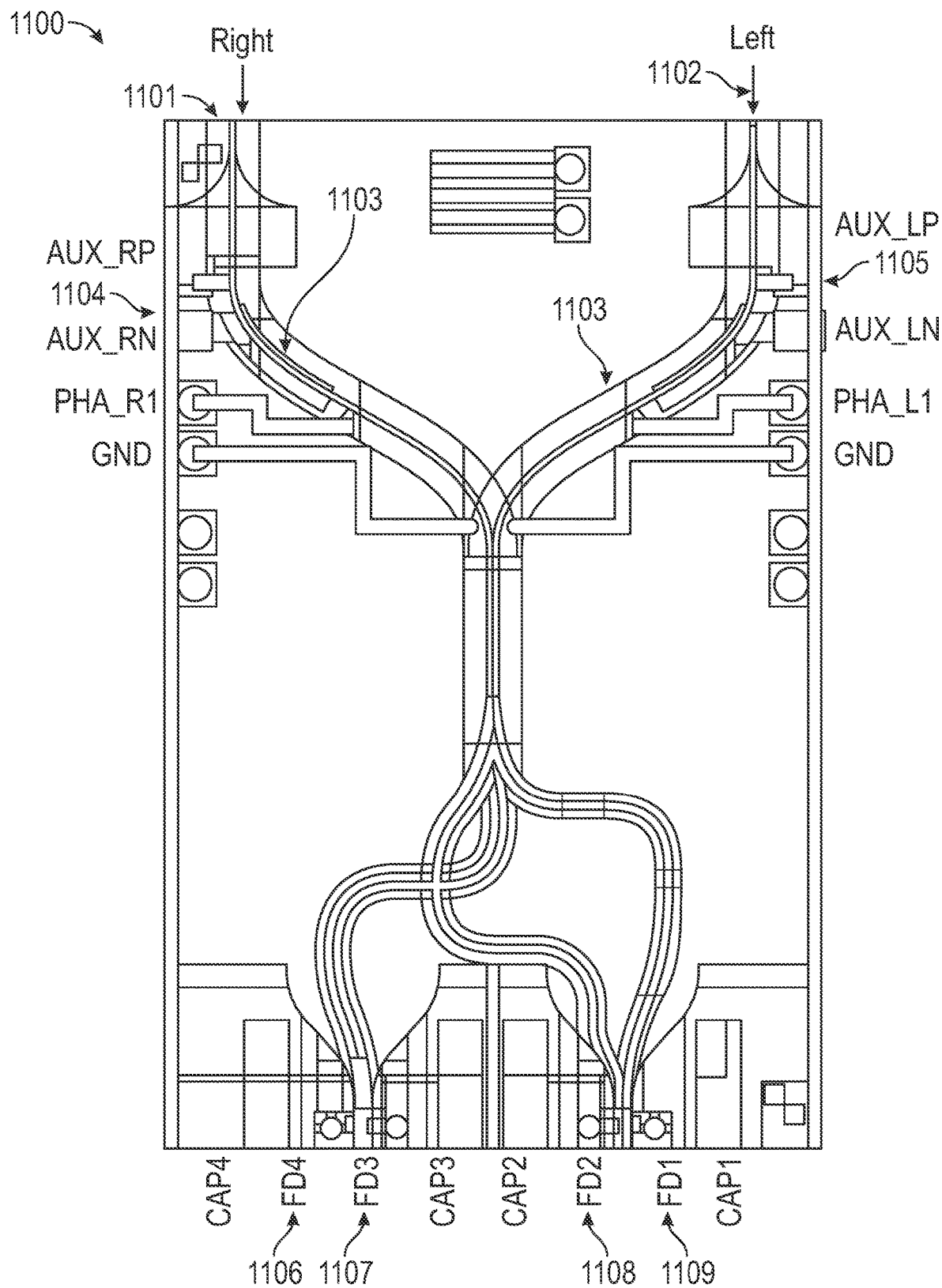
FIG. 11 is a schematic diagram of a coherent detector according to an embodiment.

In an embodiment, the waveguide is used in a coherent receiver. FIG. 11 is a schematic diagram of a typical coherent receiver to which the disclosed technique may be applied. The coherent receiver 1100 has optical inputs 1101, 1102, a continuous optical waveguide 1103 and four photodiodes 1106, 1107, 1108, 1109. The waveguide has short lengths provided with auxiliary electrodes 1105, 1106. The auxiliary electrodes are negatively biased according to the method of this disclosure, to draw out excess carriers. As a consequence, increased numbers of photons are received at the photodiodes. It should be noted that the bias voltage applied to the waveguide sections for optical loss reduction is normally much lower than that typically used for biasing in photodiodes.

Figure 12:
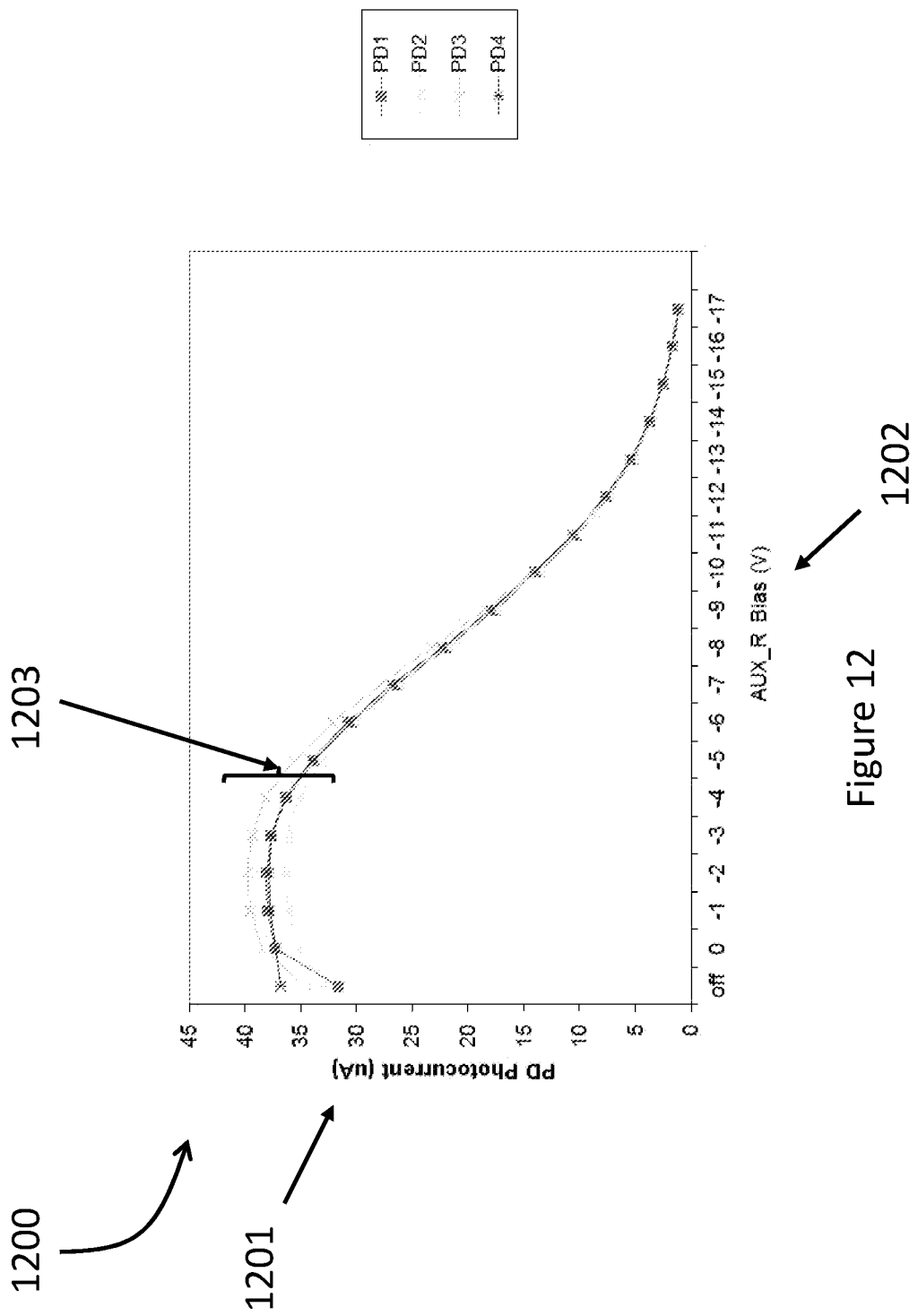
FIG. 12 is a graph of photocurrent against bias voltage for the coherent detector of FIG. 10 when operated at 1527 nm.
Figure 13:
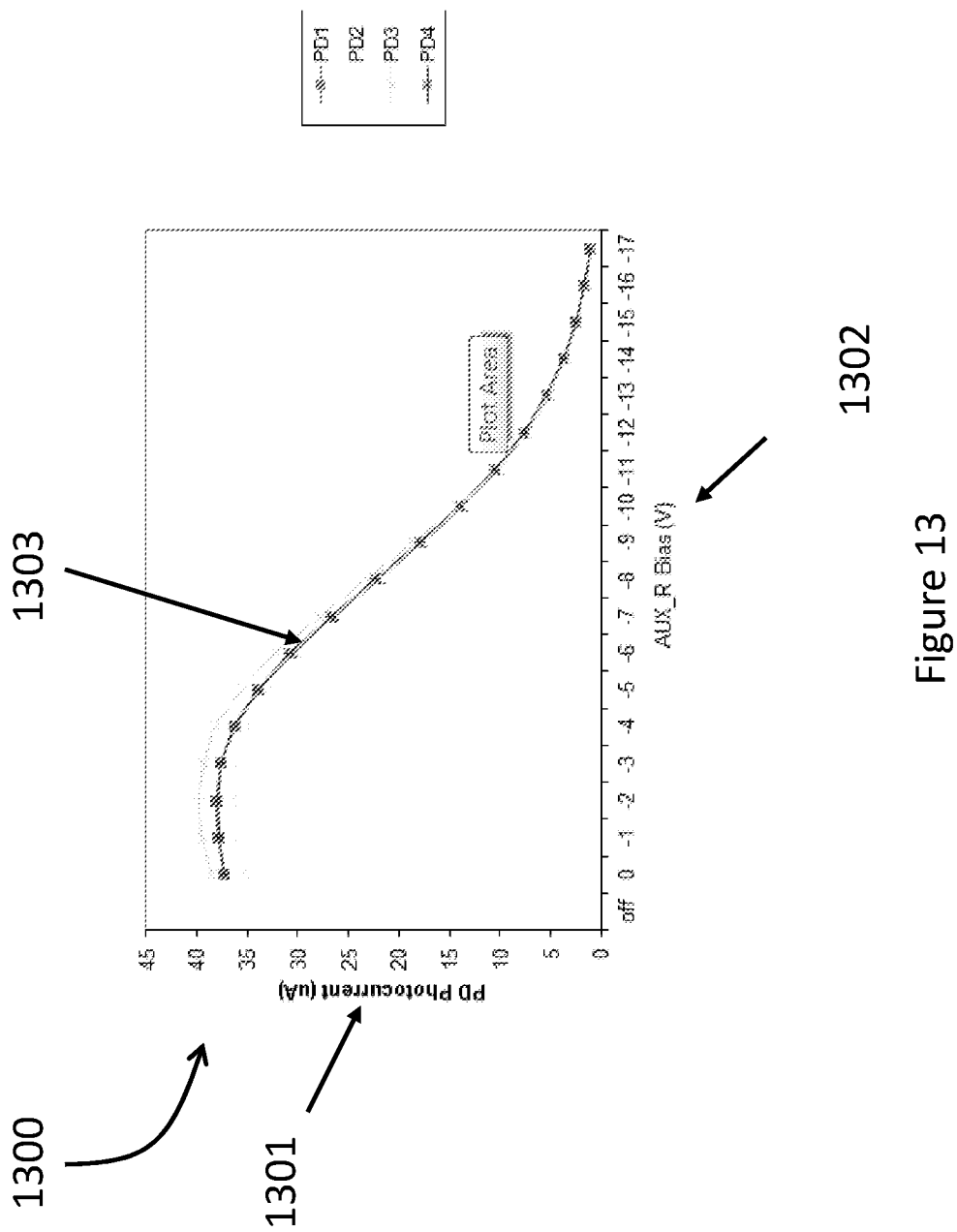
FIG. 13 is a graph of photocurrent against bias voltage for the coherent detector of FIG. 10 when operated at 1570 nm.

FIGS. 12 and 13 are graphs 1200, 1300 showing photocurrent 1201, 1301 received at the photodiodes against bias voltage 1202, 1302. The photocurrent for each of the photodiodes is shown 1203, 1303. FIG. 12 shows the results for a wavelength of 1527 nm and FIG. 13 shows the results for a wavelength of 1570 nm.

As an example of the performance improvement that can be attained, it has been demonstrated that in the coherent receiver, a typical improvement of −4% (−0.2 dB) can be achieved with wavelengths between 1513 nm to 1570 nm, 2% with a wavelength of 1615 nm, with a negatively biased waveguide section<500 μm, chip length 4 mm, and waveguide length>5 mm. Peak waveguide loss reduction was obtained at −2V.

In an alternative embodiment, the full length of the optical waveguide is provided with an electrode. Using a longer electrode, with a larger fraction of the total waveguide length, enables improved carrier withdrawal and more waveguide loss improvement. In an embodiment the application of a negative bias is applied to the full length of the waveguide, enabling the optical loss to be optimised. This allows flexibility in the material photoluminescence (PL) wavelength whilst achieving low loss.

It has been estimated that the waveguide loss improvement will scale with fraction of the waveguide covered by the electrode. For a 50% waveguide coverage with negatively biased electrode, 0.85 dB improvement is possible and this improvement will increase as the coverage increases up to 100% coverage.

The present disclosure has mainly been described above with reference to a few embodiments. However, as is readily appreciated by a person skilled in the art, other embodiments than the ones disclosed above are equally possible within the scope of the present disclosure, as defined by the appended claims.

The invention claimed is:

1. A method of operating an optoelectronic device comprising an optical waveguide section that includes a semiconductor core, the method comprising:
   determining, based on Franz-Keldysh effect, Free carrier plasma effect, and Inter-valence band absorption, a range for a negative bias voltage for the optical waveguide section for which an optical loss of the semiconductor core is lower than an optical loss at zero bias for an operating wavelength range of the optoelectronic device;
   selecting a bias voltage within the operating wavelength range; and
   applying the bias voltage to the optical waveguide section.

2. The method according to claim 1, wherein the bias voltage corresponds to a minimum optical loss.

3. The method according to claim 1, wherein the bias voltage is varied along a length of the optical waveguide section by use of a segmented electrode.

4. The method according claim 1, wherein the optoelectronic device is a semiconductor laser.

5. The method according to claim 1, wherein the optical waveguide section is a passive section of a semiconductor laser.

6. The method according to claim 1, wherein
the optical waveguide section is part of an optical receiver, and
the optical receiver includes at least one photodiode.

7. An optical waveguide section comprising:
an intrinsic semiconductor core located between doped semiconductor cladding layers; and
a biasing apparatus for providing a negative bias voltage across the optical waveguide section,
wherein the negative bias voltage is selected, based on Franz-Keldysh effect, Free carrier plasma effect, and Inter-valence band absorption, from a range of voltages for which an optical loss of the intrinsic semiconductor core is lower than an optical loss at zero bias for a selected wavelength range.

8. The optical waveguide section according to claim 7, wherein the biasing apparatus comprises a segmented electrode for varying the negative bias voltage along a length of the optical waveguide section.

9. An optoelectronic device comprising the optical waveguide section according to claim 7.

10. A semiconductor laser comprising the optical waveguide section according to claim 7.

11. The semiconductor laser according to claim 10, wherein the semiconductor laser is wavelength tuneable.

12. The semiconductor laser according to claim 11, wherein the semiconductor laser is thermally tuned.

13. The semiconductor laser according to claim 11, wherein the semiconductor laser is electrically tuned.

14. An optical receiver comprising:
the optical waveguide section according to claim 7; and
a photodiode.

15. The optical receiver according to claim 14, wherein the optical receiver is a coherent receiver.

* * * * *